United States Patent [19]
Crespi et al.

[11] Patent Number: 5,886,510
[45] Date of Patent: Mar. 23, 1999

[54] CIRCUIT FOR DIAGNOSING THE STATE OF AN ELECTRICAL LOAD

[75] Inventors: Angelo Crespi; Stefania Chicca, both of Milan; Paolo Mastella; Vanni Poletto, both of Alessandria, all of Italy

[73] Assignees: Magneti Marelli S.p.A., Agrate Brianza; SGS-Thomson Microelectronics S.r.l., Milan, both of Italy

[21] Appl. No.: 932,063

[22] Filed: Sep. 15, 1997

[30] Foreign Application Priority Data

Sep. 17, 1996 [EP] European Pat. Off. .............. 96830472

[51] Int. Cl.⁶ ....................................................... G05F 1/40
[52] U.S. Cl. .............................. 323/273; 361/86; 324/503
[58] Field of Search ................................ 323/273; 361/18, 361/86; 324/415, 503; 340/644

[56] References Cited

U.S. PATENT DOCUMENTS

| | | |
|---|---|---|
| 4,962,350 | 10/1990 | Fukuda . |
| 5,166,549 | 11/1992 | DeDoncker ............................. 323/235 |
| 5,304,935 | 4/1994 | Rathke et al. .......................... 324/415 |
| 5,311,138 | 5/1994 | Ott et al. ................................. 324/503 |
| 5,467,240 | 11/1995 | Williamson et al. . |
| 5,570,259 | 10/1996 | Allmeier et al. .......................... 361/86 |
| 5,623,254 | 4/1997 | Brambilla et al. ...................... 340/644 |

FOREIGN PATENT DOCUMENTS

| | | |
|---|---|---|
| 0 159 257 A1 | 3/1985 | European Pat. Off. . |
| 0 621 638 A1 | 4/1994 | European Pat. Off. . |
| 2168211 | 6/1986 | United Kingdom . |

*Primary Examiner*—Stuart N. Hecker
*Attorney, Agent, or Firm*—Allen, Dyer, Doppelt, Milbrath & Gilchrist, P.A.

[57] ABSTRACT

A circuit for diagnosing the state of a load connected to a driver includes a DMOS transistor interposed between a terminal of the load and voltage comparator circuits. The DMOS transistor limits the maximum voltage input to the comparators to thereby reduce the circuit area occupied by the comparators and consequently to reduce the cost of the diagnosis circuit.

38 Claims, 6 Drawing Sheets

CIRCUIT FOR DIAGNOSING THE STATE OF AN ELECTRICAL LOAD

FIELD OF THE INVENTION

The present invention relates, in general, to diagnosing circuits and, more specifically, to circuits for diagnosing the state of an electrical load.

BACKGROUND OF THE INVENTION

The invention addresses the problem of the diagnosis of the state of a load when a circuit driving the load is de-activated, that is, with its output at high impedance. The load may be in the short-circuited state (to ground, to the supply, or between its terminals). The circuit may also be in the open-circuit state (for example, because of a broken contact), or in a normal state, that is, connected and operating correctly. The diagnostic data may be supplied, for example, to a microcontroller which can implement recovery operations to ensure functioning in the event of a breakdown.

Obtaining the diagnostic data may be particularly advantageous for applications with supply voltages and ambient temperatures which are variable over a wide range, for example, in automotive applications. In this case, the diagnosis circuit if preferably able to withstand the maximum output voltage applicable to the load, for example, 50 V. Clearly, if the diagnosis circuit is produced in the form of an integrated circuit, components capable of withstanding high voltages occupy a larger area and therefore involve a higher cost. A reduction in the number of high-voltage components is therefore important for minimizing the area occupied by the circuit. Such a circuit is also desirably able to withstand the variations which take place in the characteristics of the electronic devices when the ambient temperature varies over a wide range, for example, from −40° C. to 125° C.

FIG. 1 is a circuit diagram showing a typical configuration in which the use of a diagnosis circuit may be necessary. One terminal of an electrical load LD is connected to an output OUT of a driver circuit DR. The driver circuit DR may be, for example, an amplifier, an output stage, or the like. It can be enabled or disabled (with the output OUT at high impedance) according to the value of an enabling logic input EN. When the driver circuit DR is enabled, a logic input IN selects the supply (positive or earth) to which the output OUT is connected. The other terminal TR of the load LD is connected to a supply, also to ground, or to another driver circuit (not shown). This diagram includes the possibilities of so-called "low side", "high side" and "bridge" driver circuits.

The basic layout used in diagnosis circuits according to the prior art is shown in FIG. 2. In FIG. 2 and the following drawings, parts and elements already described with reference to FIG. 1 have been attributed the same reference numerals and/or letters. The output of the driver circuit DR, that is, the terminal OUT is connected to two high-voltage polarizing resistors Rpu and Rpd, and to the high-voltage comparators CDT. When the enabling input EN of the driver circuit DR switches, disabling the circuit DR, the power transistors of the circuit DR are cut off and the voltage at the output OUT is brought to a value which depends upon the state of the output OUT, as described below:

if the load LD is correctly connected, the voltage at the output OUT is brought to a value close to that of the other terminal TR of the load LD, if the output OUT is short-circuited to ground, the voltage is brought to a value close to 0 V, if the output OUT is short-circuited to the supply Vdd, the voltage is brought to the value of the supply Vdd, and if the load LD is disconnected, that is, in an open circuit condition, the voltage at the output OUT is brought to a value determined by the voltage divider formed by the resistors Rpu and Rpd.

Discrimination between these conditions is carried out by means of the high-voltage comparators CDT. The situation in which the terminals of the load LD are short-circuited is distinguished from that in which the load LD is connected correctly by means of circuits, within the driver circuit DR, which can detect the presence of an overcurrent. Unfortunately, this approach has the disadvantage, however, that the resistors Rpu and Rpd and the comparators CDT have to withstand a high voltage, necessitating the use of large components. This approach according to the prior art also has the disadvantage of being very complex and consequently expensive.

SUMMARY OF THE INVENTION

In view of the foregoing background, it is therefore an object of the present invention to provide a circuit for diagnosing the state of an electrical load which uses high voltage portions which require less area on the integrated circuit.

According to the present invention, this object is achieved by means of a circuit for diagnosing the state of an electrical load comprising voltage comparator means operatively connected to the output driver circuit and the electrical load for determining a state of the electrical load, wherein the voltage comparator means has an input and is operable at a relatively low voltage. Moreover, the circuit includes a transistor interposed between the output of the driver circuit and the input of the voltage comparator means for reducing a maximum voltage at the input of the voltage comparator means. The circuit may further include amplifier means connected to the input of the voltage comparator means and configured for generating a current flowing into or out of the input based upon a voltage difference between a voltage of the input and a reference voltage. The amplifier means may be a transconductance differential amplifier having an output connected to the input of the voltage comparator means, a non-inverting input connected to the reference voltage, and an inverting input connected to the output of the transconductance amplifier.

A reference voltage may be connected to the input of the voltage comparator. In one embodiment a resistive divider may generate the reference voltage. A voltage at the input of the voltage comparator means is preferably equal to a voltage at the output of the driver circuit if the output voltage is below a predetermined threshold value, and is preferably equal to the predetermined threshold value if the output voltage is above the predetermined threshold value. The predetermined threshold value is preferably determined by a supply voltage of a control terminal of the transistor.

The interposed transistor preferably comprises a first DMOS transistor. In addition, in one embodiment the circuit may include a second DMOS transistor interposed between the output of the amplifier means and the input of the voltage comparator means.

The voltage comparator means preferably comprises a first comparator circuit and a second comparator circuit. These are configured for comparing a voltage at the input thereof with first and second predetermined reference values to determine the state of the load.

BRIEF DESCRIPTION OF THE DRAWINGS

Further advantages and characteristics of the present invention will become clear from the following detailed description, given with the aid of the appended drawings, provided by way of non-limiting example, in which.

DETAILED DESCRIPTION OF THE PREFERRED EMBODIMENT

Figure 1:
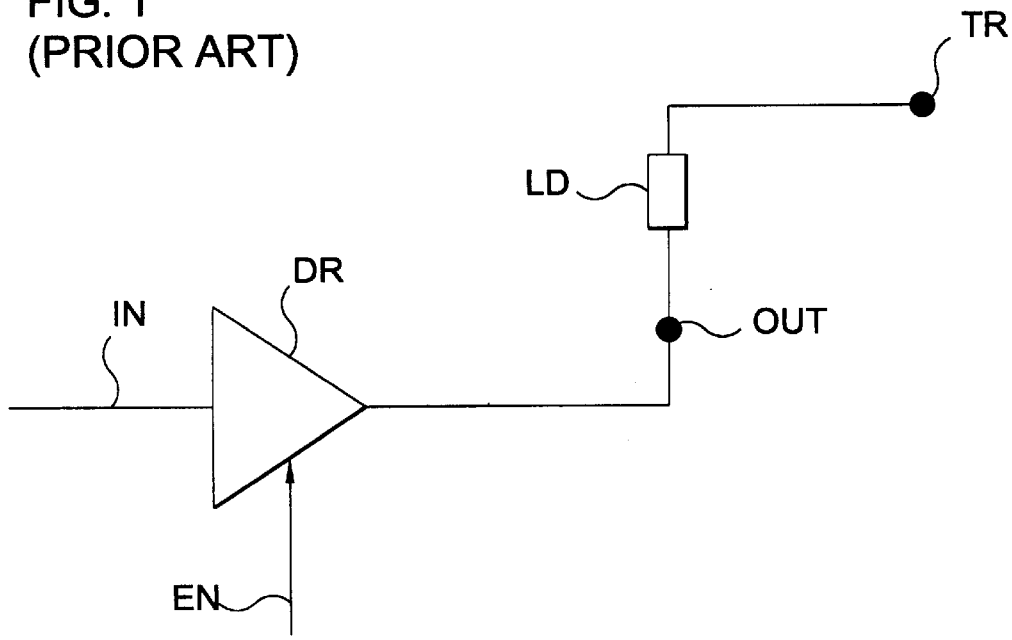
FIGS. 1 and 2 are diagrams of circuits of the prior art and have already been described.
Figure 2:
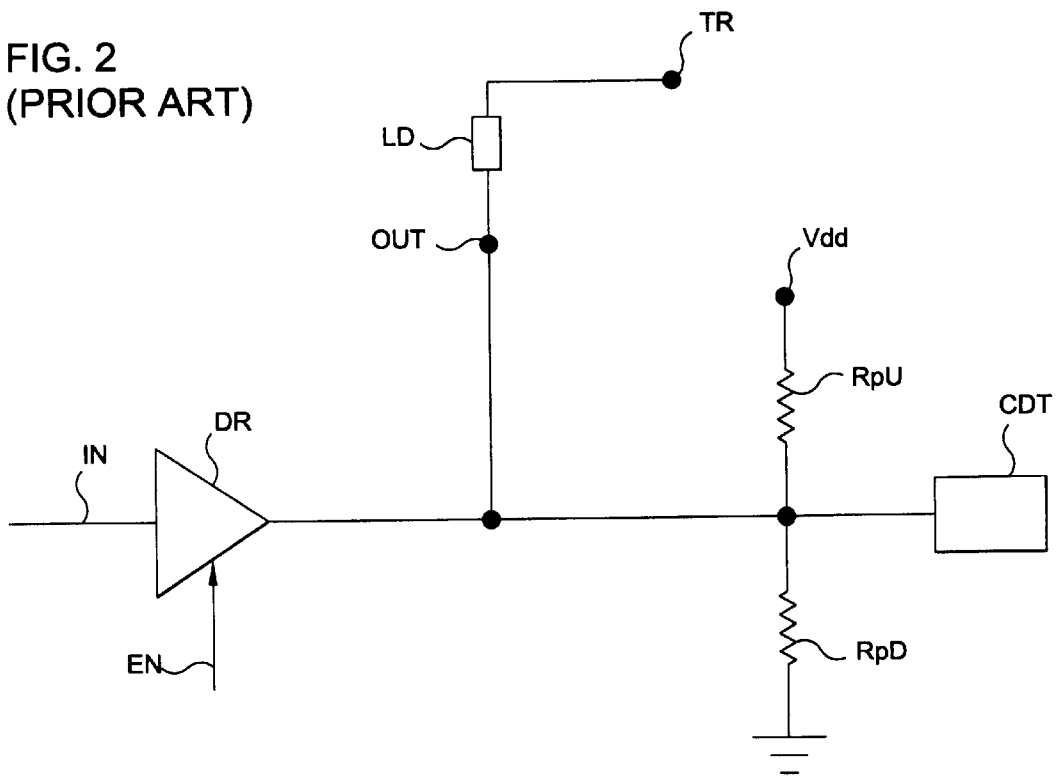
Figure 3:
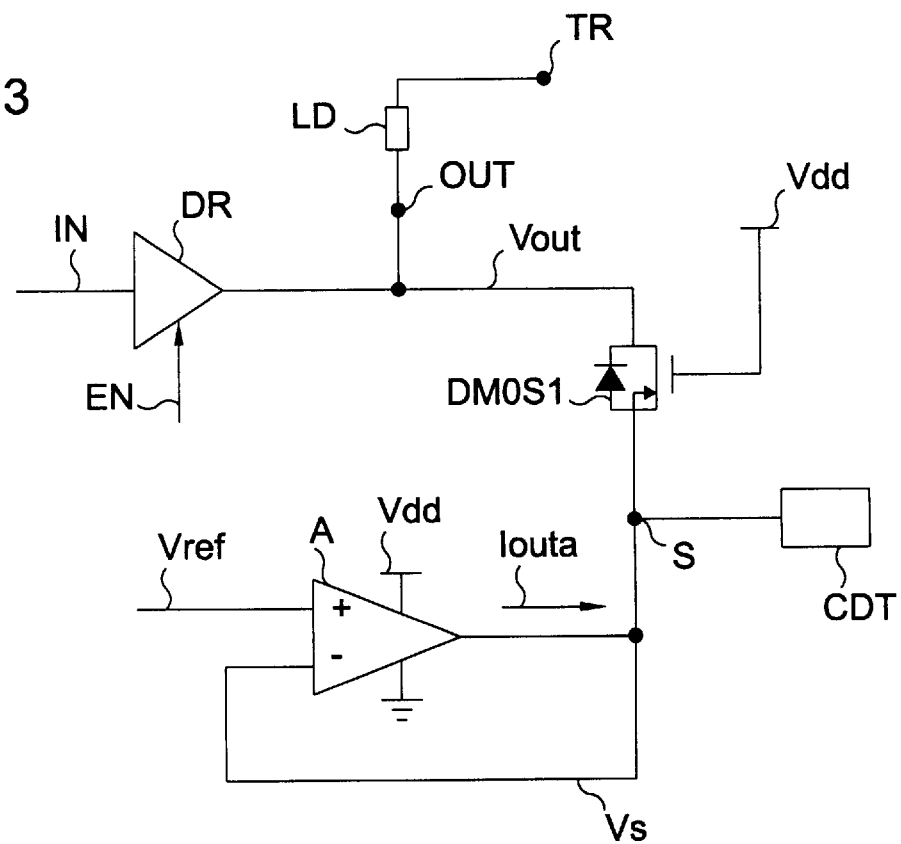
FIG. 3 is a diagram of an embodiment of a diagnosis circuit according to the invention.

An embodiment of the diagnosis circuit according to the invention will now be described with reference to FIG. 3. This drawing shows a driver circuit DR, to the output OUT of which a load LD is connected as described above with reference to the prior art. The invention is based upon the principle that it is not necessary to have a direct connection to the output OUT to carry out the diagnosis. Rather the desired measurements can be taken at a node which has a voltage equal to the voltage, indicated Vout, of the output OUT only when the latter is below a value which can be withstood by low-voltage devices.

A DMOS transistor, indicated DMOS1, connected to the output OUT of the driver circuit DR, can withstand a high voltage, for example 50 V. The circuits connected downstream of the transistor DMOS1 are at low voltage and the transistor DMOS1 is therefore the only high-voltage component used for diagnosing the state of the load LD. The gate terminal of the transistor DMOS1 is connected to a low-voltage supply Vdd, for example, a 5 V supply. The voltage of the source terminal of the transistor DMOS1, indicated as a node S does not exceed a voltage value Vs max given by:

$$V_{s\_max} = Vdd - Vth$$

where Vth is the threshold voltage of the transistor DMOS1.

In fact, if the voltage, indicated vs. of the node S were greater than the voltage Vs_max, the voltage Vgs, that is, the voltage between the gate and source terminals of the transistor DMOS1, would be less than the threshold voltage Vth and the transistor DMOS1 would therefore be cut off. In this case, the voltage Vs of the node S would be that determined by an amplifier A, the output of which is connected to the node S and would be less than the voltage Vs_max.

Figure 4:
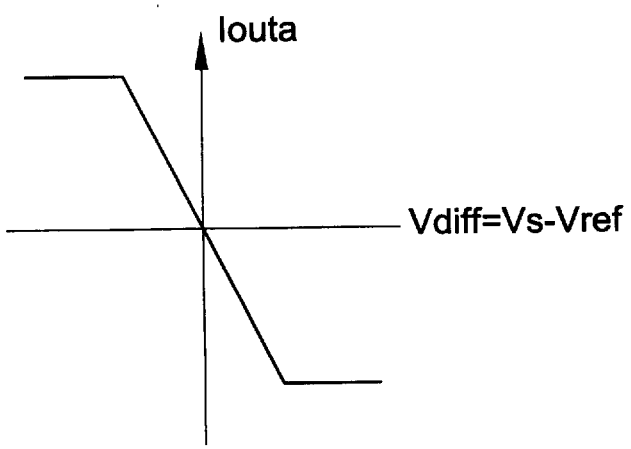
FIG. 4 is a Cartesian graph showing the operation of the circuit of FIG. 3, FIGS. 5 to 7 are diagrams of alternative embodiments of the diagnosis circuit according to the invention.

The amplifier A is a transconductance differential amplifier and has feedback from its output which is connected to its inverting input. The non-inverting input, on the other hand, is connected to a reference voltage Vref which is less than the voltage Vs_max and can be produced by, for example, a resistive divider. FIG. 4 shows an output current Iouta of the amplifier A, dependent upon a differential input voltage Vdiff equal to the difference between the inverting input voltage, that is, the voltage Vs at the node S and the voltage at the non-inverting input, that is, the reference voltage Vref. The transistor DMOS1 is used for conducting current from the source terminal to the drain terminal, that is, from the node S to the output OUT, as well as for conducting current from the drain terminal to the source terminal, that is, from the output OUT to the node S.

The maximum value of the current flowing from the source terminal to the drain terminal of the transistor DMOS1 is selected so as to be small enough not to activate the intrinsic diode between the source terminal and the drain terminal of the transistor DMOS1. When the driver circuit DR is disabled, the voltage Vs reached at the node S depends upon the state of the output OUT as described below:

- if the load LD is correctly connected, it is brought to a value close to that of the other terminal TR of the load LD, if this is below the voltage Vdd-Vth, or to the voltage Vdd-Vth,
- if the output OUT is short-circuited to ground, it is brought to a value close to 0 V,
- if the output OUT is short-circuited to the positive supply Vdd, it is brought to the voltage Vdd-Vth, or
- if the output OUT is in the open-circuit state, the voltage vs of the node S is brought by the amplifier A with feedback to a voltage equal to the reference voltage Vref; in fact, during the transient state, if Vs<Vref, the current Iouta flows out of the output of the amplifier A and increases the voltage Vs of the node S; if Vs>Vref, the current Iouta flows into the output of the amplifier A and reduces the voltage Vs of the node S. The voltage Vout of the output OUT is brought to the value of the reference voltage Vref even in the presence of a leakage current (within or outside the circuit), into or out of the output OUT, of a value up to that of the current Iouta output by the amplifier A.

The low-voltage comparators CDT can thus recognize the voltage range in which the node S is situated. In situations in which the output OUT is connected to a positive voltage by means of the load LD or by means of a short-circuit, the amplifier A absorbs a current and the transistor DMOS 1 conducts a current from the drain terminal to the source terminal. In situations in which the output OUT is connected to ground by means of the load LD or by means of a short-circuit, the amplifier A supplies a current and the transistor DMOS1 conducts a current from the source terminal to the drain terminal without activating the intrinsic diode between source and drain.

Figure 5:
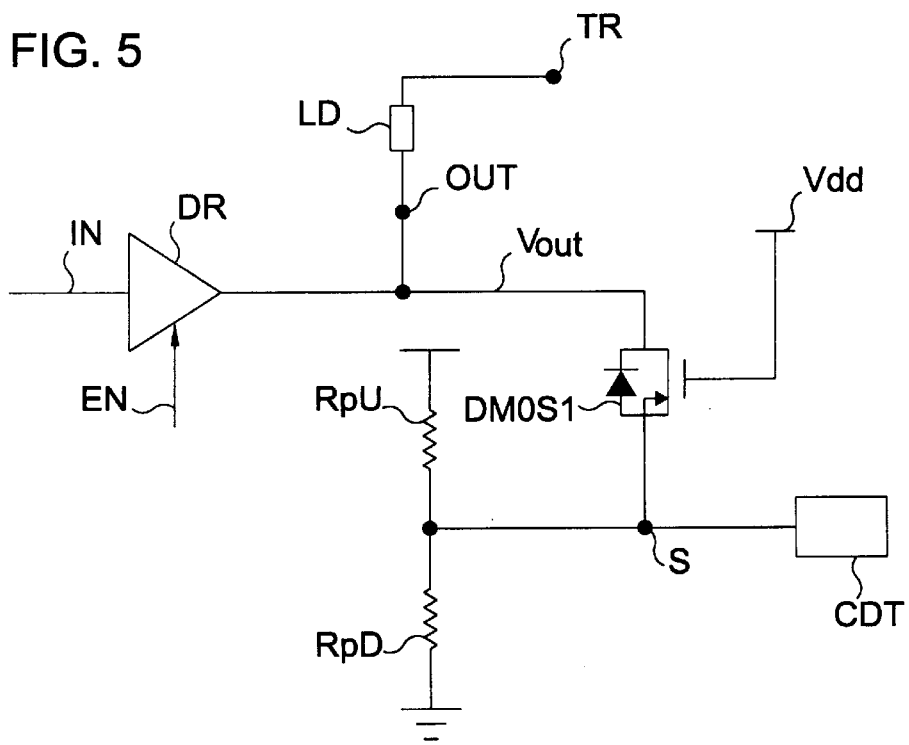
Figure 6:
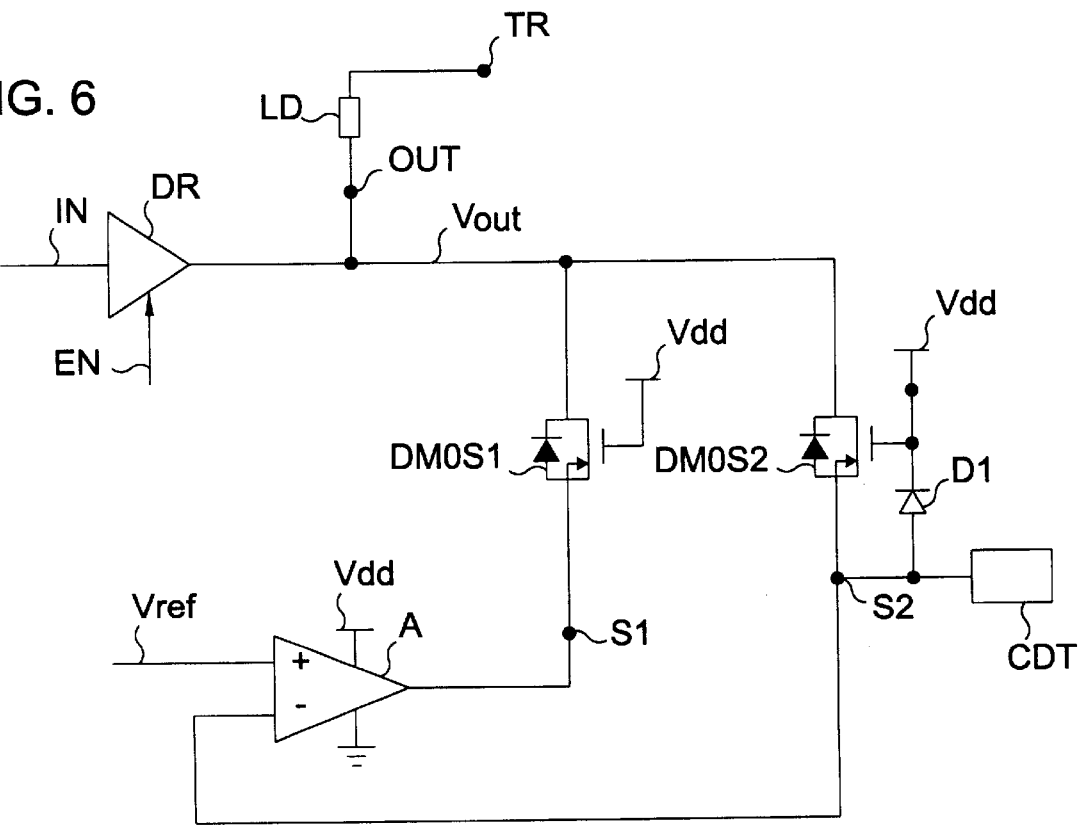

FIG. 5 shows an alternative embodiment of the circuit according to the invention in which the amplifier A is replaced by a resistive divider formed by two resistors Rpu and Rpd which, if the output OUT is in the open circuit state with the driver circuit DR disabled, determines the value of the voltage Vs of the node S. When the transistor DMOS1 conducts a current, with reference to FIG. 3, its voltage Vds, that is, the voltage between the drain and source terminals, introduces a small potential difference between the output OUT and the input of the comparators CDT, or node S even when Vout<Vdd-Vth. This provides a source of inaccuracy if the switching thresholds of the comparators CDT are required to relate precisely to the voltage Vout of the output OUT, since the voltage read by the comparators CDT is that of the node S. If it is desired to increase the degree of accuracy, one of the following approaches may be adopted:

- increasing the area (the number of cells for vertical DMOS transistors) of the transistor DMOS1, reducing its voltage Vds for a given current, or
- duplicating the transistor DMOS1; this approach, which is shown in FIG. 6, is described below.

The transistor DMOS1 has the task of conducting a current absorbed or supplied by the amplifier A and of limiting the voltage Vs of the node S1. The transistor DMOS2 has the task of making available a voltage equal to the voltage Vout of the output OUT, and limited to a maximum value which is not dangerous for the amplifier A and the comparators CDT.

The voltage at the node S1 cannot rise above a voltage value Vs1_max given by:

$$Vs1\_max = Vdd - Vth1$$

in which Vth1 is the threshold voltage of the transistor DMOS1.

The voltage at the node S2 cannot rise above a voltage value Vs2_max given by:

$$Vs2\_max = Vdd + Vd1$$

where Vd1 is the voltage of a diode D1; this diode D1 may be formed by the base-collector junction of an NPN bipolar transistor.

The voltage Vds of the transistor DMOS2 for voltages Vout of less than Vdd at the output OUT, is almost zero since the current coming from or absorbed by the amplifier A passes through the transistor DMOS1 and because the amplifier A and the comparators CDT have high-impedance inputs; they therefore receive a voltage Vs2 of the node S2 which, if Vout<Vdd, is almost identical to the voltage Vout of the output OUT. The diode D1 prevents the source terminal of the transistor DMOS2 from assuming high voltage values which could damage the gate oxide of the DMOS2 transistor as a result of stray capacitances during rapid transitions of the output OUT.

Figure 7:
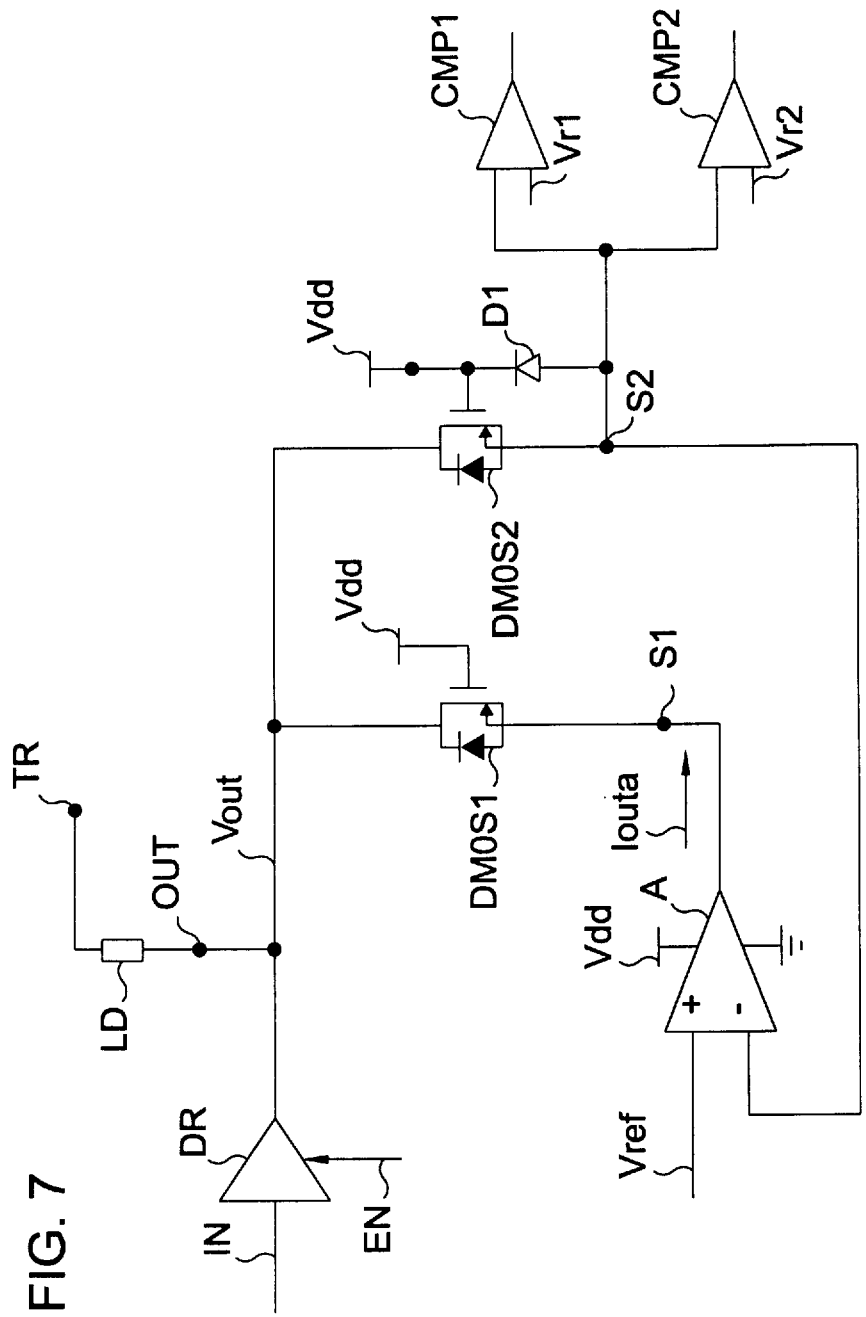
Figure 8:
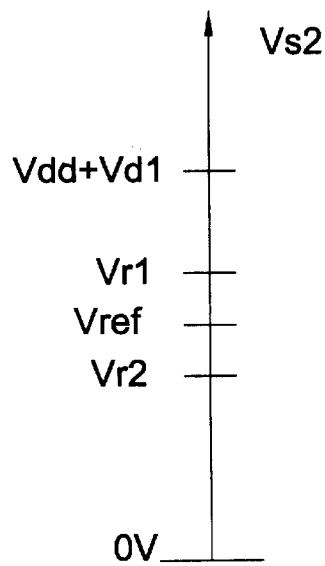
FIG. 8 is a graph illustrating an operating principle of the circuit of FIG. 7, and FIGS. 9 and 10 are diagrams of alternative embodiments of the diagnosis circuit according to the invention.

FIG. 7 shows a circuit illustrating a possible embodiment of the comparators CDT which comprise two comparator circuits CMP1 and CMP2. Two thresholds Vr1 and Vr2 of the comparator circuits CMP1 and CMP2 are shown in FIG. 8. The reference voltage Vref of the amplifier A is between the thresholds Vr1 and Vr2. The maximum value which the voltage of the node S2 can assume is given by Vdd+Vd1.

The two comparator circuits CMP1 and CMP2 enable the range in which the output OUT is situated to be recognized for the voltage values which are of interest (for 0V<Vout<Vdd, the voltages Vout and Vs2 coincide). The indications of the comparators CDT and of the overcurrent detection circuits included in the driver circuit DR thus enable the condition of the load LD to be known.

Figure 9:
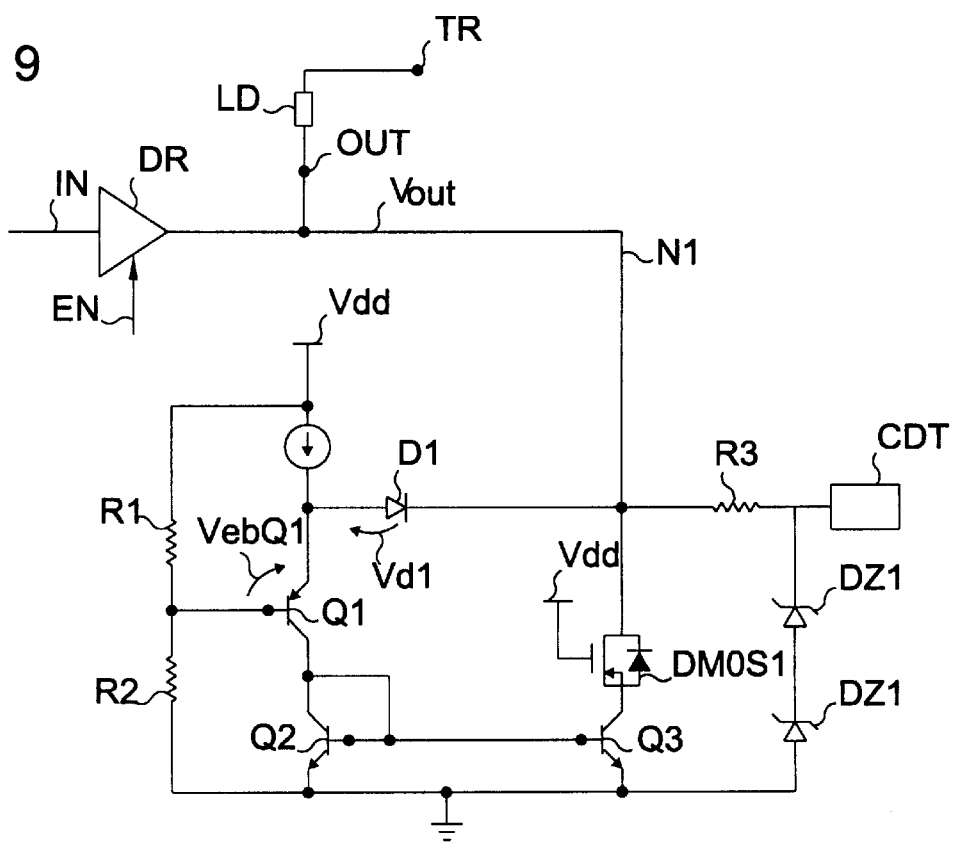

Another particular embodiment of the invention is shown in FIG. 9. With the driver circuit DR disabled, if the output is in the open-circuit state, a node N1 is brought to a voltage Vn1 given by:

$$Vn1 = Vb1 + VebQ1 - Vd1$$

where VebQ1 is the voltage between the emitter and the base of a transistor Q1, Vd1 is the voltage at the terminals of the diode D1, and Vb1 is the voltage at the base of the transistor Q1.

The voltage VebQ1 is approximately equal to the voltage Vd1 and the voltage Vn1 is thus approximately equal to the voltage Vb1. The voltage Vb1 may have, for example, a value of 2 V and no current will flow in the resistor R3 since the Zener diodes DZ1 and DZ2 are cut off and the comparators CDT have high input impedance. With the output in the open circuit state, the current mirror formed by two transistors Q2 and Q3 causes the collector current of the transistor Q1 and the current flowing in the diode D1 to be equal so as to make the voltages VebQ1 and Vd1 very similar. The transistor DMOS1 has its gate terminal connected to the supply voltage Vdd and limits the collector voltage of the transistor Q3.

If the load LD is correctly connected to the output OUT, the output OUT is brought to a voltage Vout close to that of the other terminal TR of the load LD. If the output OUT is short-circuited to the supply Vdd or to ground, the voltage Vout is brought to values corresponding thereto. The low-voltage comparators CDT are protected by Zener diodes DZ1 and DZ2.

Figure 10:
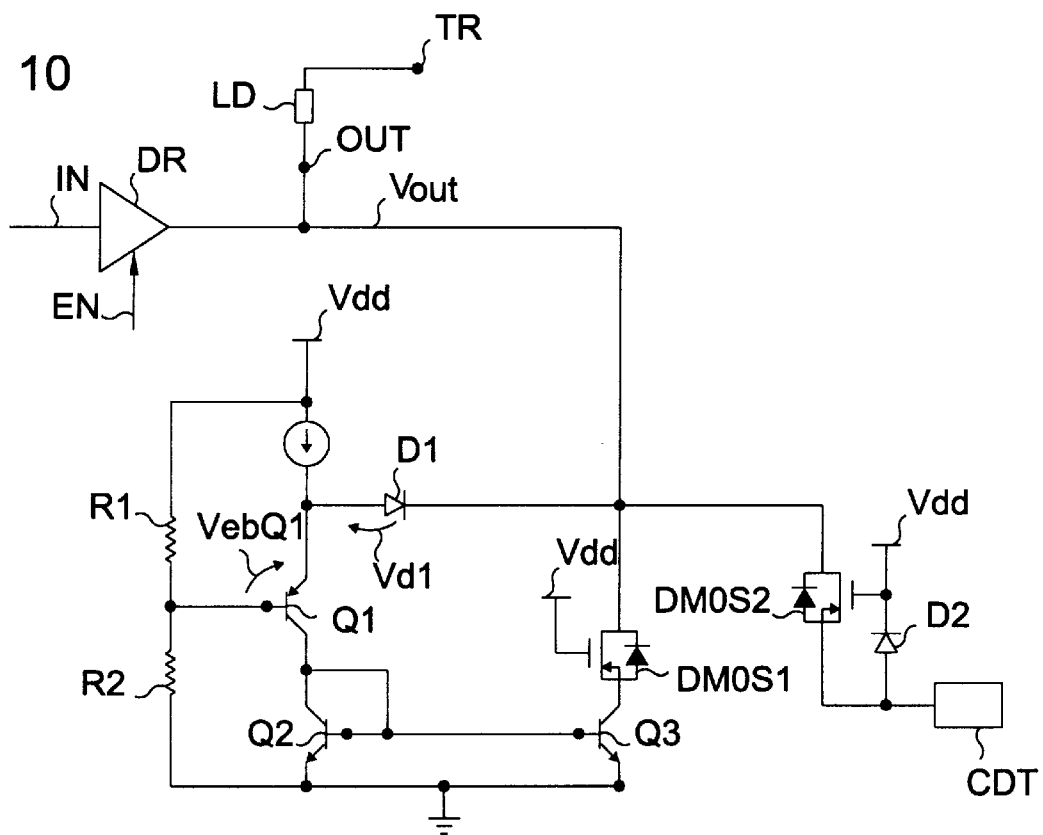

FIG. 10 shows a particular embodiment of the circuit in which, in comparison with the previous embodiment, the low-voltage comparators CDT are protected by a DMOS transistor DMOS2 and by a diode D2 instead of by the resistor R3 and by the Zener diodes DZ1 and DZ2. The functions of the transistor DMOS2 and of the diode D2 are similar to those of the transistor DMOS2 and of the diode D1 shown in the circuit of FIG. 6.

The invention has been developed for a specific application for diagnosing the state of a load LD in a "low side" driver circuit. For this purpose, the diagram of FIG. 7 was used. The values of the thresholds Vr1, Vr2 and of the reference voltage Vref are:

Vr1=2 V Vr2=1 V Vref=1.5 V.

The diagnosis circuit according to the invention is therefore particularly advantageous in applications in which the supply voltage and the ambient temperature may vary over a wide range. In particular, the circuit according to the invention enables the number of high voltage components to be reduced, reducing the area occupied by the circuit. Naturally, with the principles of the invention remaining the same, the details of construction and forms of embodiment may be varied widely with respect to those described and illustrated, without thereby departing from the scope of the present invention.

What is claimed is:

1. A circuit for diagnosing a state of an electrical load connected to an output of a driver circuit, the circuit comprising:

voltage comparator means operatively connected to the output driver circuit and electrical load for determining a state of the electrical load, said voltage comparator means having an input and being operable at a relatively low voltage; and a transistor interposed between the output of the driver circuit and the input of said voltage comparator means for reducing a maximum voltage at the input of said voltage comparator means.

2. A circuit according to claim 1, further comprising amplifier means connected to the input of said voltage comparator means and configured for generating a current flowing into or out of the input based upon a voltage difference between a voltage of the input and a reference voltage.

3. A circuit according to claim 2, wherein said amplifier means comprises a transconductance differential amplifier having an output connected to the input of said voltage comparator means, a non-inverting input connected to the reference voltage, and an inverting input connected to the output of the transconductance amplifier.

4. A circuit according to claim 2, further comprising a resistive divider generating the reference voltage.

5. A circuit according to claim 2, wherein said transistor comprises a first DMOS transistor; and further comprising a second DMOS transistor interposed between the output of said amplifier means and the input of said voltage comparator means.

6. A circuit according to claim 1, wherein a reference voltage is connected to the input of said voltage comparator.

7. A circuit according to claim 1, wherein a voltage at the input of said voltage comparator means is equal to a voltage at the output of the driver circuit if the output voltage is below a predetermined threshold value, and is equal to the predetermined threshold value if the output voltage is above the predetermined threshold value.

8. A circuit according to claim 7, wherein the predetermined threshold value is determined by a supply voltage of a control terminal of said transistor.

9. A circuit according to claim 1, wherein said voltage comparator means comprises a first comparator circuit and a second comparator circuit which are configured for comparing a voltage at the input thereof with first and second predetermined reference values to determine the state of the load.

10. A circuit for diagnosing a state of an electrical load connected to an output of a driver circuit, the circuit comprising:
    at least one voltage comparator operatively connected to the output driver circuit and electrical load for determining a state of the electrical load, said at least one voltage comparator having an input and being operable at a relatively low voltage; and
    a transistor interposed between the output of the driver circuit and the input of said at least one voltage comparator for reducing a maximum voltage at the input of said at least one voltage comparator.

11. A circuit according to claim 10, further comprising an amplifier connected to the input of said at least one voltage comparator and configured for generating a current flowing into or out of the input based upon a voltage difference between a voltage of the input and a reference voltage.

12. A circuit according to claim 11, wherein said amplifier comprises a transconductance differential amplifier having an output connected to the input of said at least one voltage comparator, a non-inverting input connected to the reference voltage, and an inverting input connected to the output of the transconductance amplifier.

13. A circuit according to claim 11, further comprising a resistive divider generating the reference voltage.

14. A circuit according to claim 11, wherein said transistor comprises a first DMOS transistor; and further comprising a second DMOS transistor interposed between the output of said amplifier and the input of said at least one voltage comparator.

15. A circuit according to claim 10, wherein a reference voltage is connected to the input of said at least one voltage comparator.

16. A circuit according to claim 10, wherein a voltage at the input of said at least one voltage comparator is equal to a voltage at the output of the driver circuit if the output voltage is below a predetermined threshold value, and is equal to the predetermined threshold value if the output voltage is above the predetermined threshold value.

17. A circuit according to claim 16, wherein the predetermined threshold value is determined by a supply voltage of a control terminal of said transistor.

18. A circuit according to claim 10, wherein said at least one voltage comparator comprises a first comparator circuit and a second comparator circuit which are configured for comparing a voltage at the input thereof with first and second predetermined reference values to determine the state of the load.

19. A circuit for diagnosing a state of an electrical load connected to an output of a driver circuit, the circuit comprising:
    at least one voltage comparator operatively connected to the output driver circuit and electrical load for determining a state of the electrical load, said at least one voltage comparator having an input and being operable at a relatively low voltage; and
    a DMOS transistor interposed between the output of the driver circuit and the input of said at least one voltage comparator for reducing a maximum voltage at the input of said at least one voltage comparator.

20. A circuit according to claim 19, further comprising an amplifier connected to the input of said at least one voltage comparator and configured for generating a current flowing into or out of the input based upon a voltage difference between a voltage of the input and a reference voltage.

21. A circuit according to claim 20, wherein said amplifier comprises a transconductance differential amplifier having an output connected to the input of said at least one voltage comparator, a non-inverting input connected to the reference voltage, and an inverting input connected to the output of the transconductance amplifier.

22. A circuit according to claim 20, further comprising a resistive divider generating the reference voltage.

23. A circuit according to claim 20, further comprising a second DMOS transistor interposed between the output of said amplifier and the input of said at least one voltage comparator.

24. A circuit according to claim 19, wherein a reference voltage is connected to the input of said at least one voltage comparator.

25. A circuit according to claim 19, wherein a voltage at the input of said at least one voltage comparator is equal to a voltage at the output of the driver circuit if the output voltage is below a predetermined threshold value, and is equal to the predetermined threshold value if the output voltage is above the predetermined threshold value.

26. A circuit according to claim 25, wherein the predetermined threshold value is determined by a supply voltage of a control terminal of said transistor.

27. A circuit according to claim 19, wherein said at least one voltage comparator comprises a first comparator circuit and a second comparator circuit which are configured for comparing a voltage at the input thereof with first and second predetermined reference values to determine the state of the load.

28. A circuit comprising:
    a driver circuit and an electrical load connected thereto; and
    a circuit for diagnosing a state of the electrical load and comprising
        at least one voltage comparator operatively connected to the output driver circuit and electrical load for determining a state of the electrical load, said at least one voltage comparator having an input and being operable at a relatively low voltage; and
        a transistor interposed between the output of the driver circuit and the input of said at least one voltage comparator for reducing a maximum voltage at the input of said at least one voltage comparator.

29. A circuit according to claim 28, further comprising an amplifier connected to the input of said at least one voltage comparator and configured for generating a current flowing into or out of the input based upon a voltage difference between a voltage of the input and a reference voltage.

30. A circuit according to claim 29, wherein said amplifier comprises a transconductance differential amplifier having an output connected to the input of said at least one voltage comparator, a non-inverting input connected to the reference voltage, and an inverting input connected to the output of the transconductance amplifier.

31. A circuit according to claim 29, wherein said transistor comprises a first DMOS transistor; and further comprising a second DMOS transistor interposed between the output of said amplifier and the input of said at least one voltage comparator.

32. A circuit according to claim 28, wherein a reference voltage is connected to the input of said at least one voltage comparator.

33. A circuit according to claim 28, further comprising a resistive divider generating the reference voltage.

34. A circuit according to claim 28, wherein a voltage at the input of said at least one voltage comparator is equal to a voltage at the output of the driver circuit if the output voltage is below a predetermined threshold value, and is equal to the predetermined threshold value if the output voltage is above the predetermined threshold value.

35. A circuit according to claim 34, wherein the predetermined threshold value is determined by a supply voltage of a control terminal of said transistor.

36. A circuit according to claim 28, wherein said at least one voltage comparator comprises a first comparator circuit and a second comparator circuit which are configured for comparing a voltage at the input thereof with first and second predetermined reference values to determine the state of the load.

37. A method for diagnosing a state of an electrical load connected to an output of a driver circuit, the method comprising the steps of:

providing at least one voltage comparator operatively connected to the output driver circuit and electrical load for determining a state of the electrical load, said at least one voltage comparator having an input and being operable at a relatively low voltage; and interposing a transistor between the output of the driver circuit and the input of said at least one voltage comparator for reducing a maximum voltage at the input of said at least one voltage comparator.

38. A method according to claim 37, wherein the step of interposing a transistor comprises interposing a DMOS transistor.

* * * * *

UNITED STATES PATENT AND TRADEMARK OFFICE
CERTIFICATE OF CORRECTION

PATENT NO. : 5,886,510
DATED : March 23, 1999
INVENTOR(S) : Angelo Crespi, et al.

It is certified that error appears in the above-identified patent and that said Letters Patent is hereby corrected as shown below:

On the title page, item [73] Assignee, should read--

"SGS-Thomson Microelectronics S.r.l., Agrate

Brianza; Magneti Marelli S.p.A., Milano, both of Italy--.

Signed and Sealed this

Twenty-eighth Day of December, 1999

Attest:

Q. TODD DICKINSON

*Attesting Officer*  *Acting Commissioner of Patents and Trademarks*